(12) United States Patent
Saito et al.

(10) Patent No.: US 7,515,202 B2
(45) Date of Patent: Apr. 7, 2009

(54) COMPACT CAMERA MODULE

(75) Inventors: Masahiro Saito, Yamagata (JP); Satoshi Ajiki, Yamagata (JP); Kazuhiro Yaegashi, Yamagata (JP); Yukihiro Furusawa, Yamagata (JP); Hironori Nakajo, Kawasaki (JP); Michio Sasaki, Kamakura (JP)

(73) Assignees: Mitsumi Electric Co., Ltd., Tokyo (JP); Kabushiki Kaisha Toshiba, Tokyo (JP)

( * ) Notice: Subject to any disclaimer, the term of this patent is extended or adjusted under 35 U.S.C. 154(b) by 744 days.

(21) Appl. No.: 10/812,795

(22) Filed: Mar. 30, 2004

(65) Prior Publication Data
US 2004/0239794 A1 Dec. 2, 2004

(30) Foreign Application Priority Data
Mar. 31, 2003 (JP) .............................. 2003-096348

(51) Int. Cl.
*H04N 5/225* (2006.01)
(52) U.S. Cl. ...................................... 348/374
(58) Field of Classification Search ................. 348/373, 348/374; 257/414; 250/200
See application file for complete search history.

(56) References Cited

U.S. PATENT DOCUMENTS

| | | | | |
|---|---|---|---|---|
| 4,897,508 | A * | 1/1990 | Mahulikar et al. | 174/522 |
| 5,233,379 | A * | 8/1993 | Burnham | 396/349 |
| 5,324,888 | A * | 6/1994 | Tyler et al. | 174/536 |
| 6,483,101 | B1 * | 11/2002 | Webster | 250/216 |
| 6,738,570 | B2 * | 5/2004 | Shinohara et al. | 396/25 |
| 6,940,058 | B2 * | 9/2005 | Shiau | 250/208.1 |
| 7,161,630 | B2 | 1/2007 | Akimoto et al. | |
| 2002/0163589 | A1 | 11/2002 | Yukawa et al. | |
| 2002/0167605 | A1 * | 11/2002 | Akimoto et al. | 348/374 |

(Continued)

FOREIGN PATENT DOCUMENTS

EP 0585186 3/1994

(Continued)

OTHER PUBLICATIONS

Patent Abstract of Japan for JP-60-206377, Oct. 17, 1985.

(Continued)

*Primary Examiner*—Sinh N Tran
*Assistant Examiner*—Albert H Cutler
(74) *Attorney, Agent, or Firm*—Ladas & Parry LLP

(57) ABSTRACT

A compact camera module is disclosed that is capable of preventing adhesion of dust to an image pickup device in the compact camera module. The compact camera module includes a lens unit including a lens and a lens holder holding the lens therein and an image pickup unit attached to the lens unit. The image pickup unit includes a circuit board, an image pickup device on the circuit board, a cover member arranged on the circuit board to cover the image pickup device, and an optical filter arranged with respect to the cover member to face the image pickup device. The image pickup device is disposed in a substantially closed space formed by the circuit board, the cover member, and the optical filter. After the image pickup device is mounted on the circuit board, the image pickup device is disposed in the substantially closed space, and therefore, the compact camera module can be assembled with no occurrence of dust adhesion to the image pickup device.

5 Claims, 6 Drawing Sheets

U.S. PATENT DOCUMENTS

| | | | |
|---|---|---|---|
| 2002/0167652 A1* | 11/2002 | Ueyama | 355/67 |
| 2002/0191103 A1* | 12/2002 | Akimoto et al. | 348/374 |
| 2003/0137595 A1* | 7/2003 | Takachi | 348/340 |
| 2003/0223008 A1* | 12/2003 | Kim et al. | 348/340 |
| 2004/0017501 A1 | 1/2004 | Asaga et al. | |

FOREIGN PATENT DOCUMENTS

| | | | |
|---|---|---|---|
| EP | 1223749 | | 7/2002 |
| JP | 60-206377 | | 10/1985 |
| JP | 1-197708 | | 8/1989 |
| JP | 408146503 | * | 6/1996 |
| JP | 2001-188155 | | 7/2001 |
| JP | 2001-196568 | | 7/2001 |
| JP | 2001-333322 | | 11/2001 |
| JP | 2002-229110 | | 8/2002 |
| JP | 2002-252797 | | 9/2002 |
| JP | 2003-60948 | | 2/2003 |

OTHER PUBLICATIONS

Patent Abstract of Japan for JP-2002-229110, Aug. 14, 2002.
Patent Abstract of Japan for JP-2001-333322, Nov. 30, 2001.
Patent Abstract of Japan for JP-2001-196568, Jul. 19, 2001.
Patent Abstract of Japan for JP-1-197708, Aug. 9, 1989.

* cited by examiner

COMPACT CAMERA MODULE

BACKGROUND OF THE INVENTION

1. Field of the Invention

The present invention relates to a compact camera module, particularly, a compact camera module installed in an electronic device such as a cellular phone.

2. Description of the Related Art

FIG. 1 is a partial cross-sectional view of a compact camera module 1 of the related art. In the compact camera module 1, a square circuit board 3, on which a CCD solid image pickup device 2 is mounted, is attached to the bottom of a lens unit 4. The lens unit 4 includes a cylindrical lens holder 13 in which lenses 10 and 11 and an optical filter 12 are accommodated, and a housing 14 having an upper cylindrical portion 14a and a lower box-shaped portion 14b. The lens holder 13 is fastened to the cylindrical portion 14a of the housing 14 by threads 15. If tuning the lens holder 13, the lens holder 13 moves along an optical axis, thereby adjusting the focus point of the compact camera module 1. This compact camera module 1 is mounted on a mounting board.

If dust adheres to the surface 2a of the CCD solid image pickup device 2, the quality of the obtained image is degraded. In addition, because the surface 2a of the CCD solid image pickup device 2 is formed by a micro-lens structure and is delicate, it is not easy to remove away the dust adhering to the surface 2a. Therefore, it is important to prevent dust from adhering to the surface 2a of the CCD solid image pickup device 2.

Japanese Laid Open Patent Application No. 2001-188155 discloses a technique related to this issue.

One problem with the cameral module 1 shown in FIG. 1 is that, when assembling the cameral module 1 after the CCD solid image pickup device 2 is mounted on the circuit board 3, the CCD solid image pickup device 2 is exposed to atmosphere until the circuit board 3 is attached to the bottom of the lens unit 4, and dust may adhere to the surface 2a of the CCD solid image pickup device 2 in the assembling process. This caused a problem in production of the compact camera module in a large quantity.

SUMMARY OF THE INVENTION

According to a first aspect of the present invention, there is provided a compact camera module including a lens unit including a plurality of lens; and an image pickup unit including an image pickup device. The image pickup unit is independent from the lens unit and attached to a bottom of the lens unit. The image pickup device is disposed in a substantially closed space in the image pickup unit.

According to a second aspect of the present invention, there is provided a compact camera module comprising a lens unit including a lens and a lens holder holding the lens therein and an image pickup unit attached to the lens unit. The image pickup unit comprises a circuit board; an image pickup device on the circuit board; a cover member arranged on the circuit board to cover the image pickup device; and an optical filter arranged with respect to the cover member to face the image pickup device. The image pickup device is disposed in a substantially closed space formed by the circuit board, the cover member, and the optical filter.

According to a third aspect of the present invention, there is provided an image pickup unit for use in conjunction with a lens unit in a compact camera module, comprising a substantially closed space; and an image pickup device disposed in the substantially closed space.

According to a fourth aspect of the present invention, there is provided an image pickup unit for use in conjunction with a lens unit in a compact camera module, comprising a circuit board; an image pickup device on the circuit board; a cover member arranged on the circuit board to cover the image pickup device; and an optical filter arranged with respect to the cover member to face the image pickup device. The image pickup device is disposed in a substantially closed space formed by the circuit board, the cover member, and the optical filter.

According to a fifth aspect of the present invention, there is provided a lens unit for use in conjunction with an image pickup unit in a compact camera module, comprising a lens having a cutout; and a lens holder that holds the lens therein. A ventilation channel is formed between a wall of the cutout and the lens holder.

According to a sixth aspect of the present invention, there is provided a method of producing a compact camera module, comprising the steps of forming an image pickup unit wherein an image pickup device is disposed in a substantially closed space; and attaching the image pickup unit to a lens unit.

According to a seventh aspect of the present invention, there is provided a method of producing an image pickup unit for use in conjunction with a lens unit in a compact camera module, the method comprising the steps of installing an image pickup device on a circuit board; covering the image pickup device with a cover member to dispose the image pickup device in a substantially closed space; and arranging an optical filter with respect to the cover member to face the image pickup device.

These and other objects, features, and advantages of the present invention will become more apparent from the following detailed description of the preferred embodiments given with reference to the accompanying drawings.

BRIEF DESCRIPTION OF THE DRAWINGS

FIG. 6A is a perspective view of the upper side of a cover member 51, FIG. 6B is a perspective view of the lower side of the cover member 51, and FIG. 6C is a perspective view of the circuit board 42 with electrodes formed thereon;

DESCRIPTION OF THE EMBODIMENTS

Below, embodiments of the present invention are explained with reference to the accompanying drawings.

Figure 1:
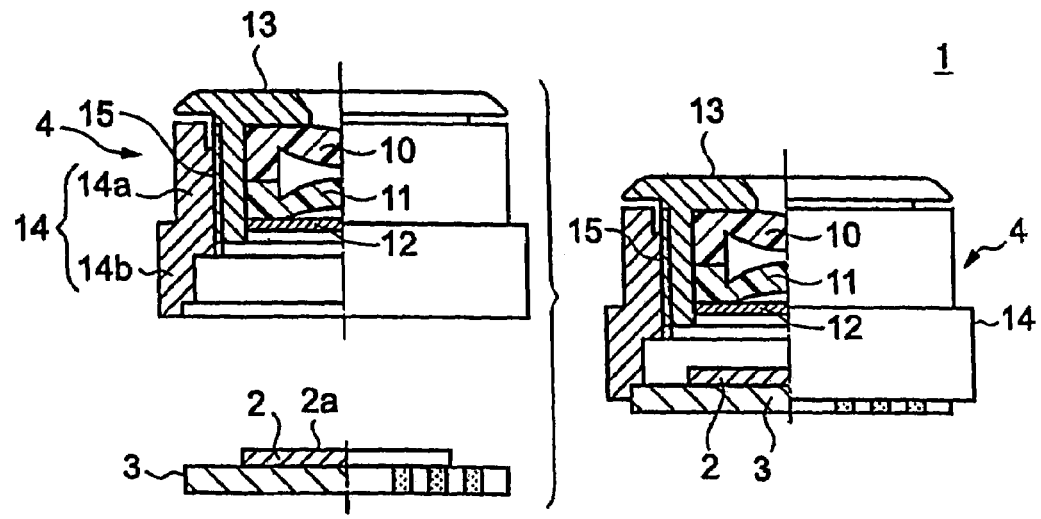
FIG. 1 is a partial cross-sectional view of a compact camera module of the related art.
Figure 2B:
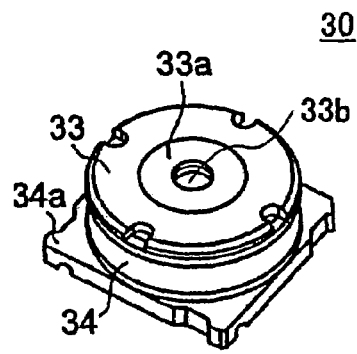
FIG. 2B is a perspective view of a lens unit 30 of the compact camera module 20.
Figure 2A:
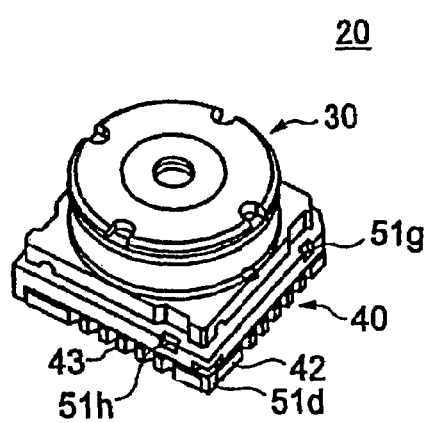
FIG. 2A is a perspective view of a compact camera module 20 according to an embodiment of the present invention.

FIG. 2A is a perspective view of a compact camera module 20 according to an embodiment of the present invention.

As illustrated in FIG. 2A, the compact camera module 20 shown in FIG. 2A includes a lens unit 30 and a solid image pickup unit 40 attached to the lens unit 30. The lens unit 30 and the solid image pickup unit 40 are independent units. In other words, the compact camera module 20 can be disassembled into the lens unit 30 and the solid image pickup unit 40.

FIG. 2B is a perspective view of the lens unit 30 of the compact camera module 20.

As illustrated in FIG. 2B, the lens unit 30 includes a cylindrical lens holder 33 and a cylindrical housing 34. The lens holder 33 has a disc-shaped upper lid 33a, and at the center of the upper lid 33a, there is an opening 33b allowing entrance of light. The housing 34 has a square flange 34a at the bottom thereof for attaching the solid image pickup unit 40 to the lens unit 30.

Figure 2C:
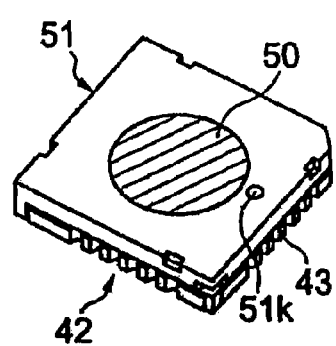
FIG. 2C is a perspective view of a solid image pickup unit 40 of the compact camera module 20.

FIG. 2C is a perspective view of the solid image pickup unit 40 of the compact camera module 20.

Figure 3A:
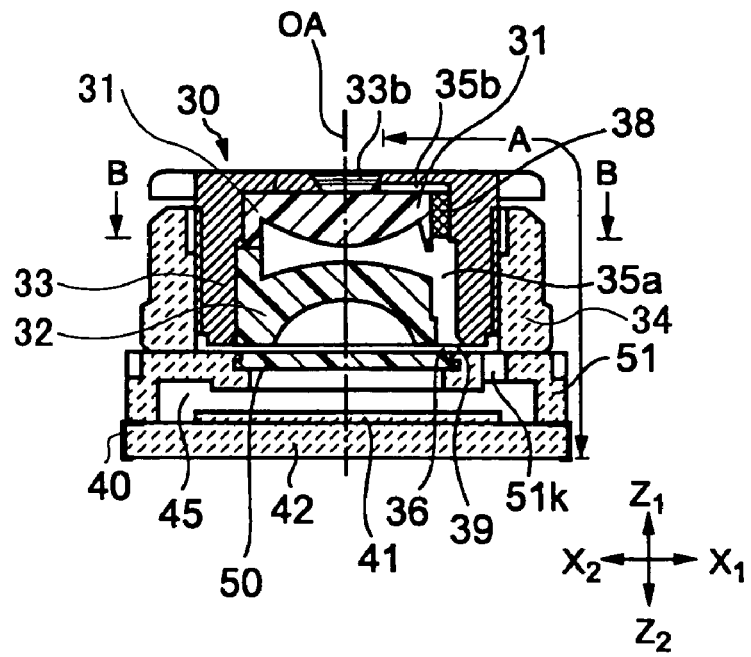
FIG. 3A is a cross-sectional view of the compact camera module 20.

As illustrated in FIG. 2C, and FIG. 3A, the solid image pickup unit 40 includes a solid image pickup device 41, a square circuit board 42, and a square cover member 51 disposed on the upper side of the circuit board 42. The cover member 51, for example, is formed from a synthesized resin. An optical filter 50, for example, in disc shape, is disposed on the cover member 51. In the cover member 51, there is formed an air hole 51k penetrating a square upper lid 51b of the cover member 51 (refer to FIG. 4B).

FIG. 3A is a cross-sectional view of the compact camera module 20.

Figure 3B:
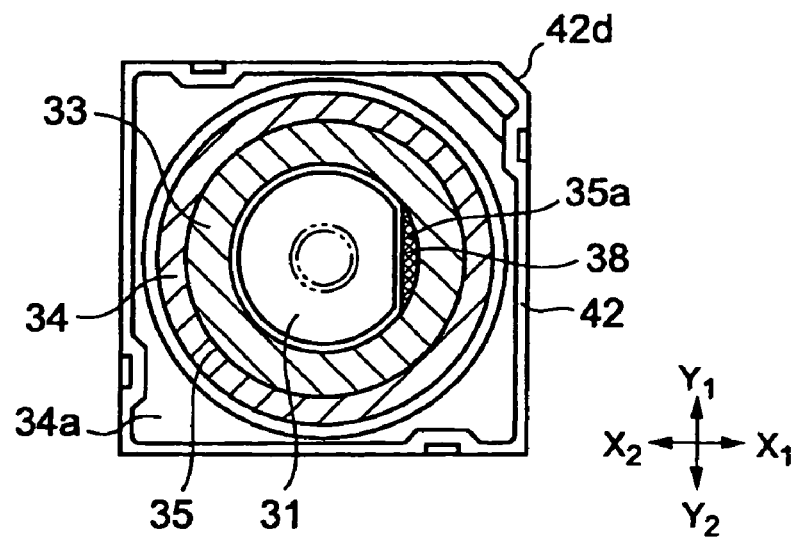
FIG. 3B is a cross-sectional view of the compact camera module 20 along the line BB in FIG. 3A.

FIG. 3B is a cross-sectional view of the compact camera module 20 along the line BB in FIG. 3A.

Figure 4A:
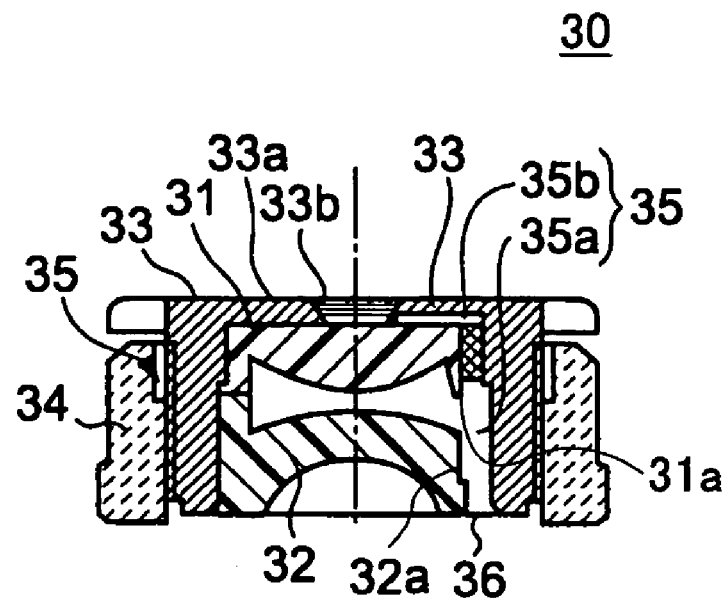
FIG. 4A is a cross-sectional view of the lens unit 30.
Figure 4B:
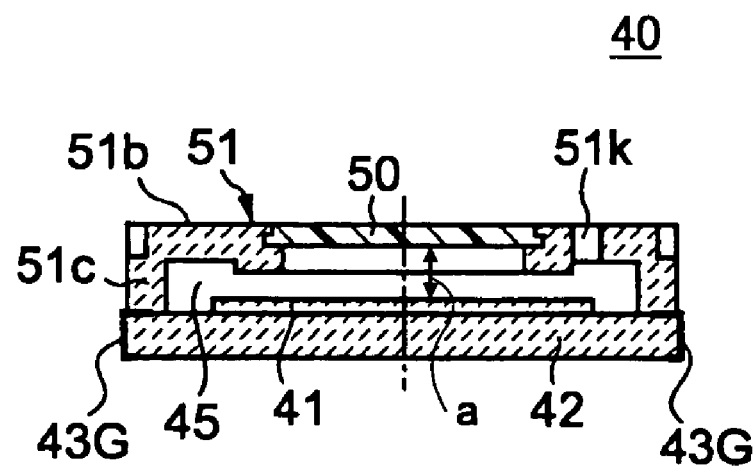
FIG. 4B is a cross-sectional view of the solid image pickup unit 40.

FIGS. 4A and 4B are cross-sectional views of the lens unit 30 and the solid image pickup unit 40, respectively.

As illustrated in FIG. 3A and FIG. 4B, the solid image pickup device 41 is installed on the square circuit board 42 of the solid image pickup unit 40, by way of example, the solid image pickup device 41 may be a CCD image pickup device, or the solid image pickup device 41 may be a MOS imaging sensor.

The optical filter 50 is arranged to be above the image pickup device 41 and separated from the image pickup device 41 by a distance of a. In the solid image pickup unit 40, there is a substantially closed space 45, that is, the space 45 is substantially sealed from the outside. The image pickup device 41 is located in the space 45.

As illustrated in FIG. 4A and FIG. 3B, in the lens unit 30, a lens 31 and a lens 32 are accommodated in the lens holder 33. The lens holder 33 is fastened to the housing 34 via threads 35. When the lens holder 33 is turned along the threads 35, the lens holder 33 moves along an optical axis OA (referring to FIG. 3A), which adjusts the focus point of the compact camera module 20. Further, cutouts 31a (for example, D-shaped cutouts) are formed in the lens 31, and cutouts 32a are formed on the lens 32 for indicating orientation of the lenses 31 and 32. Note that although only one cutout 31a and one cutout 32a are illustrated in FIG. 4A, there are a plural number of cutouts 31a in the lens 31 and a plural number of cutouts 32a in the lens 32.

Inside the lens unit 30, there is a ventilation channel 35. The ventilation channel 35 includes a first portion 35a and a second portion 35b which are in communication with each other, and the ventilation channel 35 extends between an opening 36 in the lower side of the lens unit 30 and the opening 33b in the upper lid 33a.

The first portion 35a of the ventilation channel 35 is the space between the cutouts 31a on the lens 31 and the cutouts 32a on the lens 32. The first portion 35a of the ventilation channel 35 is the space between the cutouts 31a and cutouts 32a and the lens holder 33, and extends from the opening 36 in the Z1 direction. Thus, without forming additional grooves or the like on the inner surface of the lens holder 33, a portion of the ventilation channel 35 is obtained.

The second portion 35b of the ventilation channel 35 is formed between the upper surface of the lens 31 and a groove in the lower surface of the lid 33a. The second portion 35b of the ventilation channel 35 extends from the opening 33b in the X1 direction and is in communication with the first portion 35a.

As illustrated in FIG. 3A and 3B, an air filter 38 is disposed in the upper part (Z1 side) of the first portion 35a of the ventilation channel 35.

Figure 6A:
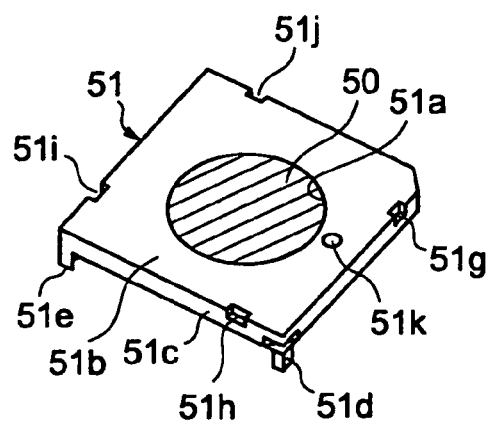
FIG. 6A through FIG. 6C are exploded perspective views of components of the solid image pickup unit 40, where
Figure 6B:
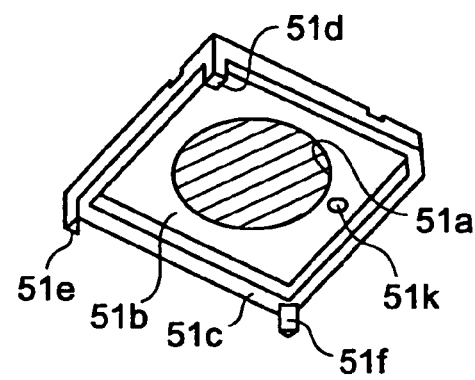

As illustrated in FIG. 4B, and FIG. 6A and FIG. 6B, the cover member 51 includes the square upper lid 51b and a square frame 51c joined with the periphery of the square upper lid 51b. The air hole 51k is formed in the upper lid 51b.

Figure 5:
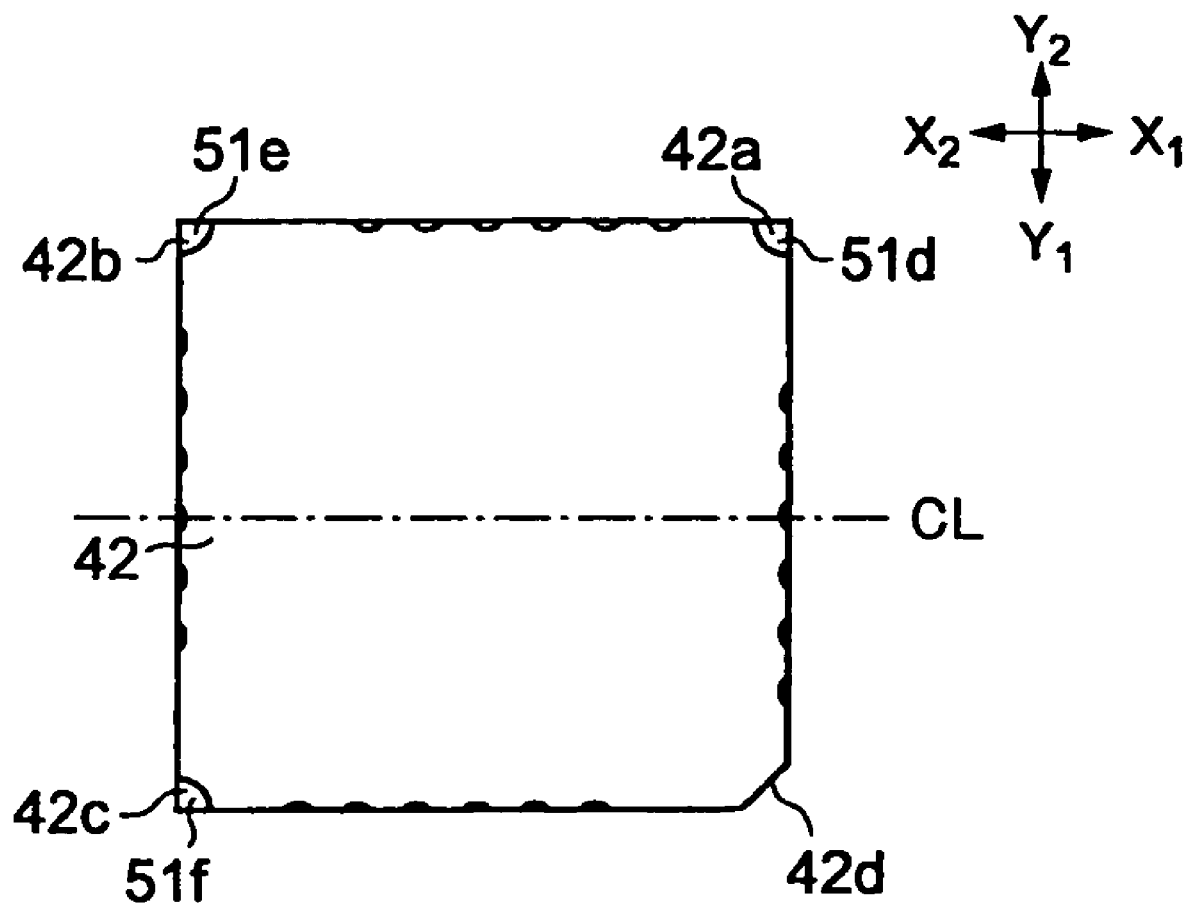
FIG. 5 is a bottom view of a circuit board 42 of the compact camera module 20.

FIG. 5 is a bottom view of the circuit board 42 of the compact camera module 20.

The circuit board 42 is in square-shaped, and three corners 42a, 42b, and 42c thereof are shaped into arcs, and the other corner 42d is beveled. That is, the circuit board 42 is asymmetric with respect to a central line CL.

The circuit board 42 and the image pickup device 41 are mounted with respect to each other. With the circuit board 42 being asymmetric, the orientation of the image pickup device 41 with respect to the circuit board 42 can be easily determined before mounting.

Figure 6C:
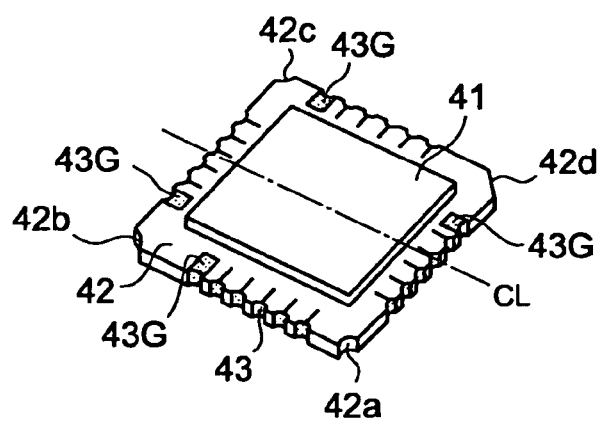

FIG. 6A through FIG. 6C are exploded perspective views of components of the solid image pickup unit 40.

FIG. 6A is a perspective view of the upper side of the cover member 51 of the solid image pickup unit 40, FIG. 6B is a perspective view of the lower side of the cover member 51, and FIG. 6C is a perspective view of the circuit board 42 having electrodes formed thereon.

As illustrated in FIG. 6A and FIG. 6B, the cover member 51 has three legs 51d, 51e, and 51f, to be joined with the corners 42a, 42b, 42c of the circuit board 42, respectively. In the four sides of the upper lid 51b, recesses 51g, 51h, 51i, and 51j are formed respectively.

As illustrated in FIG. 6C, a number of electrodes 43 are formed on the side surfaces of the circuit board 42, and among these electrodes 43, ground electrodes 43G are formed. The ground electrodes 43G are formed on the side surface of the circuit board 42, and extend up to the upper surface of the circuit board 42.

With the above described configuration, the legs 51d, 51e, 51f of the cover member 51 are joined with the corners 42a, 42b, and 42c of the circuit board 42. Thereby, the cover member 51 is posed to face the circuit board 42. The lower ends of the square frame 51c are adhered to the four sides of the circuit board 42 by using a thermosetting adhesive agent, for example. The four sides of the square frame 51c are in contact with the grounding electrodes 43G.

Furthermore, for example, referring to FIG. 3A, the lens unit 30 is installed on the solid image pickup unit 40 and is set to a predetermined position, and the flange 34a (FIG. 2B and FIG. 3B) of the housing 34 adheres to the upper lid 51b of he cover member 51 by using a thermosetting adhesive agent, for example. The opening 36 and the air hole 51k are in communication with each other through a gap 39 between the holder 33 and the cover member 51. The space 45 is in communication with the outside through the air hole 51k, the gap 39 and the ventilation channel 35. The opening 33b is the exit of the ventilation channel 35 and, as illustrated in FIG. 3A, the opening 33b is relatively far from the circuit board 42.

Figure 7A:
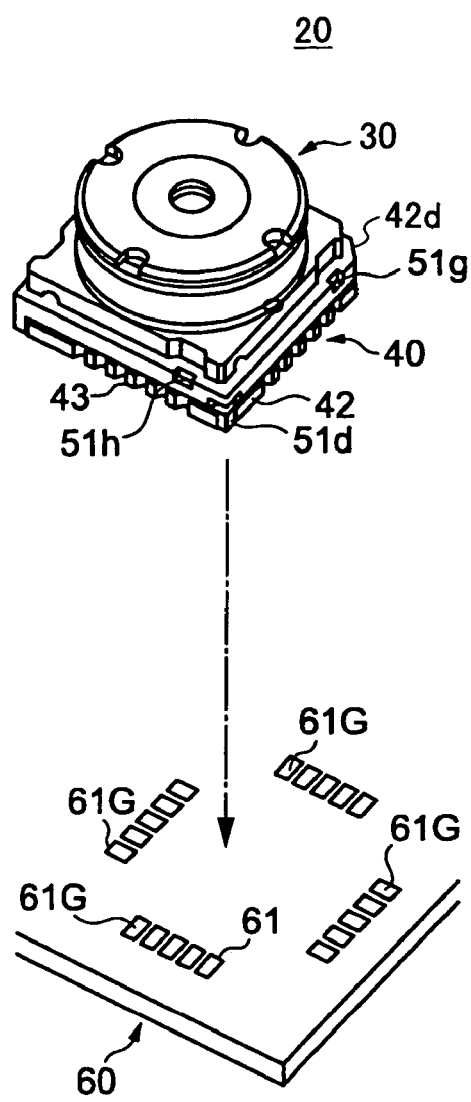
FIG. 7A is a perspective view showing mounting of the compact camera module 20 on a mounting board 60.

FIG. 7A is a perspective view showing mounting of compact camera module 20 on a mounting board 60.

As illustrated in FIG. 7A, the compact camera module 20 can be directly mounted on a mounting board 60 by soldering.

On the mounting board 60, electrode pads 61, and ground electrode pads 61G are formed corresponding to the electrodes 43 and the ground electrodes 43G on the side surface of the circuit board 42.

Figure 7B:
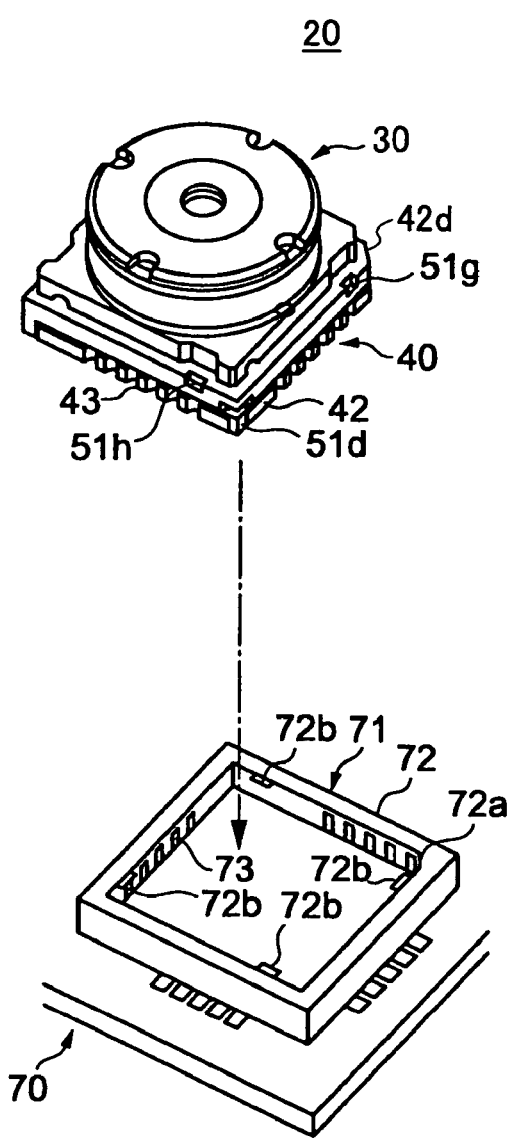
FIG. 7B is a perspective view showing mounting of the compact camera module 20 on a mounting board 70 having a socket 71.

FIG. 7B is a perspective view showing mounting of the compact camera module 20 on a mounting board 70 having a socket 71.

As illustrated in FIG. 7B, the compact camera module 20 can also be mounted on a mounting board 70 by using the socket 71. The socket 71 includes a square frame 72 and contacts 73 arranged in a line on the inner surface of the frame 72. The frame 72, for example, is formed from a synthesized resin, and is shaped in correspondence with the circuit board 42 of the compact camera module 20. A corner 72a of the frame 72 is beveled to be in correspondence with the beveled corner 42d of the circuit board 42 as illustrated in FIG. 5. In addition, the frame 72 has a projecting engagement member 72b.

When mounting the compact camera module 20 on the mounting board 70, the beveled corner 42d of the circuit board 42 is aligned with the beveled corner 72a of the frame 72, and then the compact camera module 20 is inserted into the socket 71 with an appropriate orientation. Due to this, the recesses 51g through 51j are engaged with the engagement members 72b, the electrodes 43 and the ground electrodes 43G are in contact with the contacts 73, and thereby the compact camera module 20 is mounted on the mounting board 70.

The orientation of the compact camera module 20 when the circuit board 42 is to be inserted into the socket 71 is determined by the beveled corner 42d of the circuit board 42, and with other orientations, the compact camera module 20 cannot be fit into the socket 71.

Below, an explanation is made of production of the compact camera module 20 having the above configuration, for example, for mass production of the compact camera module 20.

The compact camera module 20 can be fabricated by combining the lens unit 30 and the solid image pickup unit 40 after the lens unit 30 and the solid image pickup unit 40 are fabricated separately in large quantity.

The solid image pickup unit 40 is obtained by attaching the cover member 51 to the circuit board 42 with the solid image pickup device 41 installed thereon. When fabrication of the solid image pickup unit 40 is completed, the solid image pickup device 41 is accommodated in the space 45 and substantially sealed from the outside, and from then on the solid image pickup device 41 is substantially sealed from the outside. Hence, when fabrication of the solid image pickup unit 40 is completed, the solid image pickup device 41, specifically, the surface thereof, is under protection. As a result, the time length when the solid image pickup device 41 is exposed to the outside is greatly reduced, and dust can hardly adhere to the surface 41a of the solid image pickup device 41. Thus, it is not necessary, or at least less likely necessary to clean the surface 41a of the solid image pickup device 41.

When attaching the solid image pickup unit 40 to the lens unit 30, a location where dust adhesion may occur is the upper surface 50a of the optical filter 50. Because the optical filter 50 is at a distance of a from the solid image pickup device 41, the dust on the upper surface 50a of the optical filter 50 influences little quality of images obtained by the solid image pickup device 41.

Therefore, the compact camera module 20 of the present invention is capable of suppressing influence of dust as much as possible, enabling fabrication of the compact camera modules with high reliability.

Because the upper surface 50a of the optical filter 50 is simply a plane, as compared to the surface of the solid image pickup device 41, which is formed by a micro-lens structure and is delicate, it is easy to clean the upper surface 50a to remove dust thereon.

In addition, because the solid image pickup unit 40 is a structure independent from the lens unit 30, the solid image pickup unit 40 can be fabricated independently from the lens unit 30. Hence, even when specification of the lenses 31 and 32 changes, thereby requiring changes in the lens unit 30, fabrication of the solid image pickup unit 40 can still be continued without being influenced by such changes. That is, the compact camera module 20 of the present invention is suitable for mass production.

Below, an explanation is made of influence of a high temperature on the compact camera module 20 having the above configuration. For example, the compact camera module 20 is heated to a temperature exceeding 100 C. degrees.

When the compact camera module 20 is heated to a high temperature, air in the space 45 expands. As illustrated in FIG. 3A, because the space 45 is in communication with the outside through the air hole 51k and the ventilation channel 35, air in the space 45 can freely expand, and thus the pressure in the space 45 does not increase. As a result, there is no force imposed on the cover member 51, and deformation of the cover member 51 does not occur.

Similarly, in the lens unit 30, because the space between the lenses 31 and 32 and the lens holder 33 is in communication with the outside through the ventilation channel 35, there is no rise of pressure in this space, and no force imposed on the lens holder 33, thus no deformation of the lens holder 33.

Hence, when mounting the compact camera module 20 on the mounting board 60, As illustrated in FIG. 7A, it is possible to pass through a reflow oven. In other words, the compact camera module 20 can be soldered directly to the mounting board 60 by re-flow.

When attaching the solid image pickup unit 40 to the lens unit 30, it is possible to use a thermosetting resin required to be heated to a high setting temperature for use. In addition, even when fabricating the solid image pickup unit 40, because the space 45 is in communication with the outside through the air hole 51k, a thermosetting resin can also be used to join the cover member 51 with the circuit board 42.

As illustrated in FIG. 3A, the opening 33b, that is the exit of the ventilation channel 35, is on the upper side of the compact camera module 20, and the path length from the opening 33b to the circuit board 42 is relative very long (indicated by "A" in FIG. 3A). For this reason, even when the solder scatters in the reflow soldering process, the solder drops can hardly enter the opening 33b. Even if solder drops enters the opening 33b, the solder drops are caught by the air filter 38. As a result, the configuration of the compact camera module 20 is capable of preventing any foreign matters from entering the space between the lens 31 and the lens 32 and the space 45.

When the compact camera module 20 is directly soldered to the mounting board 60 by re-flow, static electrical charge generated on the lens unit 30 and the cover member 51 does not accumulate on the lens unit 30 and the cover member 51, but rather is discharged to a ground pattern of the mounting board 60 through the ground electrodes 43G and the ground electrode pads 61G.

If the compact camera module 20 is mounted on the mounting board 70 by inserting the compact camera module 20 into the socket 71, static electrical charge generated on the lens unit 30 and the cover member 51 is discharged to a ground pattern of the mounting board 70 through the socket 71.

Usually, a CCD image pickup device is sensitive to static electricity. In the compact camera module 20 of the present invention, because the cover member 51, which is the component closest to the solid image pickup device 41, does not possess static charge, it is possible to prevent electrostatic damage to the solid image pickup device 41. When a CMOS solid image pickup device is used instead of a CCD solid image pickup device, or a DPS for signal processing is used, the same effect of preventing the electrostatic damage to the solid image pickup device 41 can be obtained.

While the present invention has been described with reference to specific embodiments chosen for purpose of illustration, it should be apparent that the invention is not limited to these embodiments, but numerous modifications could be made thereto by those skilled in the art without departing from the basic concept and scope of the invention.

Summarizing the effect of the invention, according to one aspect of the present invention, an image pickup device is disposed in a substantially closed space.

Thereby, even in the process of assembling the compact camera module, the image pickup device is in a place where adhesion of dust to the image pickup device can hardly occur. Thus, it is possible to assemble the compact camera module with little occurrence of dust adhesion, and it is possible to reliably assemble a high-quality compact camera module.

In addition, because the image pickup unit is a structure independent from the lens unit, the image pickup unit can be fabricated independently from the lens unit. Hence, even when specification of the lens in the lens unit changes, thereby requiring changes of the lens unit, fabrication of the image pickup unit can still be continued without being influenced by such changes. That is, the compact camera module of the present invention is suitable for mass production.

According to another aspect of the present invention, an image pickup device is disposed in a substantially closed space formed by a circuit board and a cover member. Therefore, after the image pickup device is mounted on the circuit board, the image pickup device is disposed in an environment in which adhesion of dust to the image pickup device can hardly occur. Thus, it is possible to assemble the compact camera module with little occurrence of dust adhesion, and it is possible to reliably assemble a high-quality compact camera module.

By providing an optical filter can be cleaned easily, even dust adhesion occurs on the surface of the optical filter, the dust can be removed easily. In addition, the optical filter is set relative far from the image pickup device, therefore the dust adhering to the surface of the optical filter has little influence on the quality of image obtained with the compact camera module.

Because the image pickup unit is a structure independent from the lens unit, the image pickup unit can be fabricated independently from the lens unit. Hence, even when specification of the lens in the lens unit changes, thereby requiring changes of the lens unit, fabrication of the image pickup unit can still be continued without being influenced by such changes. That is, the compact camera module of the present invention is suitable for mass production.

By providing an air hole in the cover member and the ventilation channel in the lens unit, heat generated during the process of assembling the compact camera module can escape easily, and thus, influence of air expansion is avoidable. As a result, the compact camera module can be mounted directly to a mounting board by re-flow without using a socket.

By utilizing the existing cutouts, the ventilation channel can be formed easily without extra work of processing the lens holder. Because the exit of the ventilation channel is relatively far from a location of soldering when mounting the compact camera module, solder can hardly enter into the ventilation channel.

By providing an air filter, it is possible to prevent solder from passing through the ventilation channel to reach the image pickup device.

Due to the asymmetric configuration the image pickup unit, it is possible to avoid errors in the orientation of the compact camera module, and facilitates engagement of the compact camera module into the socket for mounting.

By providing a grounding terminal, static electrical charge generated during assembling can be removed away through the grounding terminal, and thereby, it is possible to prevent electrostatic damage to the image pickup device.

This patent application is based on Japanese Priority Patent Application No. 2003-096348 filed on Mar. 31, 2003, the entire contents of which are hereby incorporated by reference.

What is claimed is:

1. A compact camera module comprising a lens unit including a lens and a lens holder holding the lens therein and an image pickup unit attached to the lens unit, wherein the image pickup unit comprises:
   a circuit board;
   an image pickup device on the circuit board;
   a cover member arranged on the circuit board to cover the image pickup device; and
   an optical filter arranged with respect to the cover member to face the image pickup device,
   wherein the image pickup device is disposed in a substantially closed space formed by the circuit board, the cover member, and the optical filter,
   wherein the cover member includes an air hole to make the substantially closed space in communication with the outside to allow air to escape from the substantially closed space; the lens unit includes a ventilation channel; the air hole is in communication with the ventilation channel, and
   wherein the ventilation channel is formed between a wall of a cutout in the lens and the lens holder, and the ventilation channel extends at least from a top of the lens to a bottom of the lens.

2. The compact camera module as claimed in claim 1, wherein the ventilation channel has an air filter disposed therein.

3. The compact camera module as claimed in claim 1, wherein the image pickup unit is asymmetric with respect to a central line.

4. The compact camera module as claimed in claim 1, wherein
   a grounding terminal is formed on a side surface of the circuit board, said grounding terminal including a portion extending to an upper surface of the circuit board; and the cover member is arranged to be in contact with the portion of the grounding terminal extending to the upper surface of the circuit board.

5. A method of producing a compact camera module, comprising the steps of:

forming an image pickup unit wherein an image pickup device is disposed in a substantially closed space, wherein the step of forming the image pickup unit comprises the steps of:

installing an image pickup device on a circuit board;

covering the image pickup device with a cover member, forming an air hole in the cover member to make the substantially closed space in communication with the outside to allow air to escape from the substantially closed space;

arranging an optical filter with respect to the cover member to face the image pickup device;

wherein the cover member, optical filter, and circuit board form a substantially closed space, forming a cutout in the lens of a lens unit;

forming a ventilation channel between a wall of the cutout in the lens and a lens holder, wherein the ventilation channel extends at least from a top of the lens to a bottom of the lens; and attaching the image pickup unit to the lens unit.

\* \* \* \* \*